US006342425B1

(12) United States Patent
Joo

(10) Patent No.: US 6,342,425 B1
(45) Date of Patent: Jan. 29, 2002

(54) CAPACITOR FOR SEMICONDUCTOR MEMORY DEVICE AND FABRICATION METHOD THEREOF

(75) Inventor: Jae-Hyun Joo, Cheongju (KR)

(73) Assignee: Hyundai Electronics Industries Co., Ltd., Kyoungki-Do (JP)

( * ) Notice: Subject to any disclaimer, the term of this patent is extended or adjusted under 35 U.S.C. 154(b) by 0 days.

(21) Appl. No.: 09/417,775

(22) Filed: Oct. 14, 1999

(30) Foreign Application Priority Data

Mar. 26, 1999 (KR) .............................................. 99-10529

(51) Int. Cl.[7] .............................................. H01L 21/20
(52) U.S. Cl. .......................... 438/396; 438/3; 438/240
(58) Field of Search .......................... 438/240, 3, 396, 438/397, 398, 253, 254, 255

(56) References Cited

U.S. PATENT DOCUMENTS

| 5,122,477 | A | * | 6/1992 | Wolters et al. |
| 5,216,572 | A | * | 6/1993 | Larson et al. |
| 5,385,859 | A | | 1/1995 | Enomoto |
| 6,239,460 | B1 | * | 5/2001 | Kuroiwa et al. |

* cited by examiner

Primary Examiner—Tuan H. Nguyen
(74) Attorney, Agent, or Firm—Morgan, Lewis & Bockius LLP

(57) ABSTRACT

A capacitor for a semiconductor memory device includes a semiconductor substrate; an interlayer insulation film formed on the semiconductor substrate, having contact plugs filled with a conductive material; a diffusion barrier film formed on the interlayer insulation film including the contact plugs; a lower electrode formed on the diffusion barrier film; a dielectric film formed on the lower electrode; an upper electrode formed on the dielectric film; and a different type film formed adjacent to the upper electrode for applying a compressive stress to the dielectric film.

9 Claims, 5 Drawing Sheets

CAPACITOR FOR SEMICONDUCTOR MEMORY DEVICE AND FABRICATION METHOD THEREOF

This Application claims the benefit of Korean Application No. 10529/1999 filed on Mar. 26, 1999, which is hereby incorporated by reference.

BACKGROUND OF THE INVENTION

1. Field of the Invention

The present invention relates to a capacitor for a semiconductor memory device and a fabrication method thereof, and in particular, to a capacitor for a semiconductor memory device using a ferroelectric film as a dielectric film, and a fabrication method thereof.

2. Description of the Related Art

To achieve a higher integration rate in memory devices, a material having a high dielectric constant is used in order to increase storing capacity of a capacitor per unit area. Among materials having high dielectric constants, ferroelectric materials, such as $Pb(Zr,Ti)O_3$ (hereinafter referred to as 'PZT') and $(Ba,Sr)TiO_3$ (hereinafter referred to as 'BST') are compounds of $ABO_3$ form having a perovskite structure.

Since asymmetrical atoms exist in a lattice of the perovskite structure, a polarization generated due to an external electric field is considerably high. This is because an additional polarization is generated by a lattice displacement, in addition to an electric polarization which is normally generated when the external electric field is applied. As a result, the dielectric constant of ferroelectric materials of the perovskite structure is higher than that of other commonly used dielectric materials, such as $SiO_2$, $Si_3N_4$ and $Ta_2O_5$, by a few tens times. Thus, ferroelectric materials having the perovskite structure are employed in capacitors of a highly integrated memory device.

In addition, at a temperature below a Curie temperature and after the external electric field is removed, PZT, BST and the like have residual polarization in two different states depending on the direction of the external electric field. Thus, these materials can also be utilized as non-volatile memory devices.

In general, when a compressive stress is applied to a ferroelectric thin film, the lattice displacement is easily achieved, thereby improving its fatigue property or dielectric property. Based on this, a device property of a ferroelectric random access memory (FRAM) or a dynamic random access memory (DRAM) can be improved. There are two known methods of applying the compressive stress to the dielectric film: the first method is to use a difference in lattice constants between a substrate and the dielectric film, and the other method is to deposit the dielectric film after bending a substrate.

In accordance with the first method using the difference of the lattice constants, a material such as $SrRuO_3$ which has a similar lattice constant to the ferroelectric thin film is deposited on a MgO single crystal, and is provided with a preferred orientation. Thereafter, the ferroelectric thin film is deposited on $SrRuO_3$, thereby causing a compressive stress to the ferroelectric thin film due to the difference in the lattice constant between $SrRuO_3$ and the ferroelectric thin film. However, $SrRuO_3$ must be epitaxially deposited on the MgO single crystal. Accordingly, the deposition process is complicated, and a MgO single crystal is required. As a result, this method is difficult to be applied to an actual device fabrication process.

According to the method of depositing the ferroelectric material after bending the substrate, a compressive stress is generated on the ferroelectric material by a restoring force of the bent substrate. However, it is difficult to mount the bent substrate in a deposition chamber. It is also difficult to heat the entire bent substrate at a uniform deposition temperature. In addition, it is impossible to apply a uniform stress to the entire substrate when it is bent. Thus, this method cannot be applied practically to an actual device fabrication process.

SUMMARY OF THE INVENTION

Accordingly, the present invention is directed to a capacitor for a semiconductor memory device and its fabrication method that substantially obviates one or more of the problems due to limitations and disadvantages of the related art.

An object of the present invention is to provide a capacitor for a semiconductor memory device where a compressive stress can be easily applied to a ferroelectric thin film and can be used in a practical device fabrication process.

Another object of the present invention is to provide a fabrication method for a capacitor of a semiconductor memory device with the above-mentioned advantages.

Additional features and advantages of the present invention will be set forth in the description which follows, and in part will be apparent from the description, or may be learned by practice of the invention. The objectives and other advantages of the invention will be realized and attained by the structure, particularly pointed out in the written description and claims hereof as well as the appended drawings.

To achieve these and other advantages and in accordance with the purpose of the invention, as embodied and broadly described, a capacitor for a semiconductor device of the present invention includes: a semiconductor substrate; an interlayer insulation film having contact plugs filled with a conductive material and being formed on the semiconductor substrate; a diffusion barrier film formed on the interlayer insulation film including the contact plugs; a lower electrode formed on the diffusion barrier film; a dielectric film formed on the lower electrode; an upper electrode formed on the dielectric film; and a different type film formed adjacently to the upper electrode in order to apply a compressive stress to the dielectric film.

In another aspect, a method of fabricating a capacitor for a semiconductor device in accordance with the present invention includes a step for forming an interlayer insulation film having contact plugs filled with a conductive material on a semiconductor substrate; a step for forming a diffusion barrier film on the interlayer insulation film including the contact plugs; a step for forming a lower electrode on the diffusion barrier film; a step for forming a dielectric film on the lower electrode; a step for forming an upper electrode on the dielectric film; and a step for forming a different type film adjacently to the upper electrode in order to apply a compressive stress to the dielectric film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of the specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

A main goal of the present invention is to provide a capacitor for a semiconductor memory device where a dielectric property of the capacitor is improved by applying a compressive stress to a dielectric film. This is achieved by shrinking or expanding another film, i.e., a different type film, formed near the dielectric film.

Figure 1:
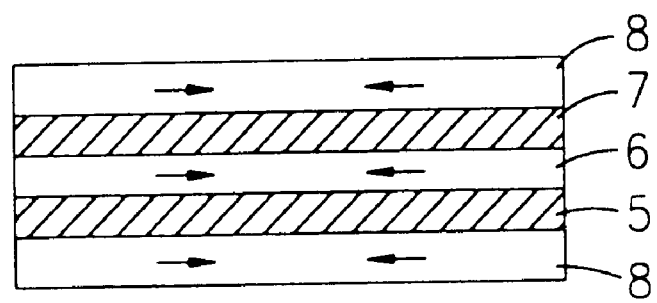
FIGS. 1 and 2 are cross-sectional views illustrating a capacitor for a semiconductor memory device in accordance with the present invention where a compressive stress is applied to a dielectric film.

FIG. 1 illustrates a state where the different type film is shrunken. Referring to FIG. 1, the different type film 8 is formed neighboring a lower electrode 5 and an upper electrode 7 in parallel to a dielectric film 6. Thereafter, the different type film 8 is shrunken by a thermal process or the like, thereby applying a compressive stress to the dielectric film 6.

Figure 2:
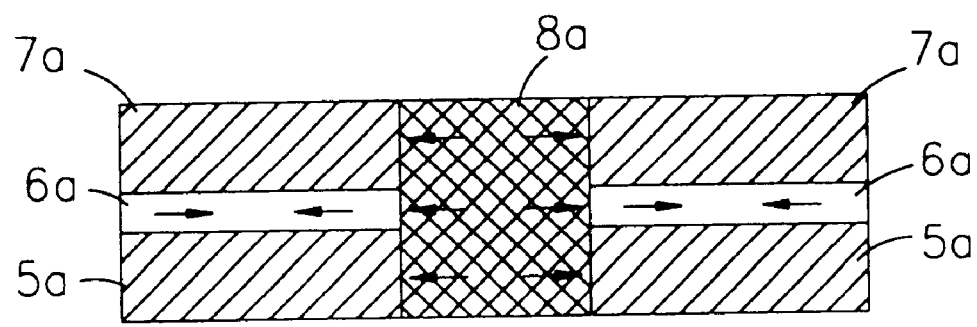

FIG. 2 illustrates a state where the different type film is expanded. As shown in FIG. 2, a different type film 8a is formed adjacently to side portions of a capacitor including a lower electrode 5a, a dielectric film 6a and an upper electrode 7a. That is, after the different type film 8a is formed in a vertical direction to the dielectric film 6a, it is then expanded. As a result, the compressive stress is generated on the dielectric film 6a.

The above-described method of applying a compressive stress to a dielectric film in a capacitor of a semiconductor memory device can be applied to a device fabrication process and will now be explained with reference to the accompanying drawings.

Figure 3A:
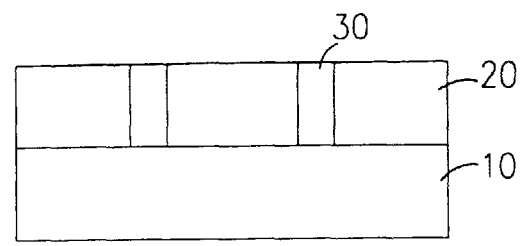
FIGS. 3A to 3I are cross-sectional views illustrating sequential steps of a process of fabricating a capacitor for a semiconductor memory device in accordance with a first embodiment of the present invention.

FIGS. 3A to 3I illustrate sequential steps of a process for fabricating a capacitor of a semiconductor device in accordance with a first embodiment of the present invention. Referring to FIG. 3A, on a semiconductor substrate 10 an interlayer insulation film 20 is formed and contact plugs 30 are formed in the interlayer insulation film 20 in order to operate the capacitor. A polycrystalline silicon of a superior step coverage is filled in the contact plugs 30. Materials such as tungsten(W) having excellent electric conductivity and step coverage may be filled in the contact plugs 30 instead of the polycrystalline silicon.

Figure 3B:
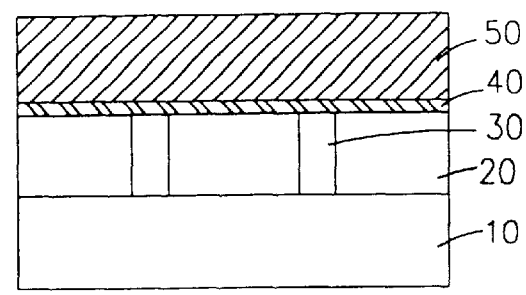

As illustrated in FIG. 3B, a diffusion barrier film 40 formed of, for example, titanium nitride (TiN), is formed on the interlayer insulation film 20 including the contact plugs 30. A lower electrode 50 formed of, for example, platinum (Pt), is formed on the diffusion barrier film 40. Here, the diffusion barrier film 40 restricts reactions between the lower electrode 50 and the contact plugs 30. For the diffusion barrier film 40, besides the above-described titanium nitride (TiN), a two-components nitride such as tantalum nitride (TaN) may be used, or a three-components nitride such as titanium-silicon-nitrogen (Ti—Si—N) or titanium-aluminum-nitrogen (Ti—Al—N) may be used in order to improve its oxidation resisting property. For the lower electrode 50, in addition to the above-described platinum (Pt), a material may be selected from the group consisting of $RuO_x$, Ru, $IrO_x$, Ir and the like. Other materials which hardly react with a dielectric film 60 to be formed later and which have a high work function may also be employed.

Figure 3C:
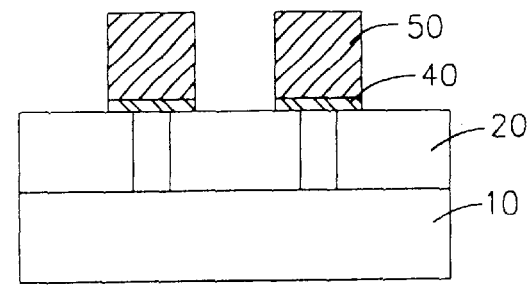

Thereafter, referring to FIG. 3C, in order to form the lower electrode 50 as a capacitor storage node, the lower electrode 50 and the diffusion barrier film 40 are patterned by using a mask (not shown). A general photoresist material can be employed as the mask. Also, a hard mask material such as $SiO_2$, TiN or Ti may be used in order to increase a selection ratio and minimize a residue.

Figure 3D:
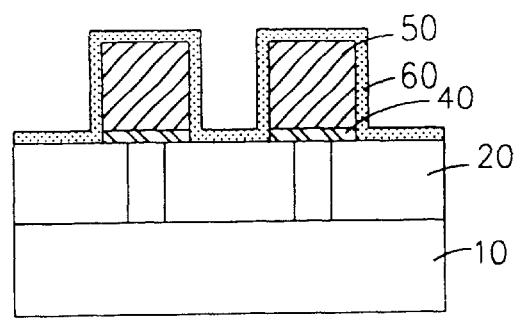

As shown in FIG. 3D, a dielectric film 60 of PZT is formed on the patterned lower electrode 50 and on the interlayer insulation film 20 by a chemical vapor deposition (CVD) process. In addition to PZT, BST can also be used as the dielectric film 60. The dielectric film 60 may also be formed by a physical vapor deposition (PVD) process, a sol-gel process, a laser ablation process and the like. Here, if the dielectric film 60 is formed of an amorphous, and thus a crystallization process by a thermal process is required, the thermal process for crystallization of the dielectric film is carried out before the thermal process for shrinking the different type film is performed.

Figure 3E:
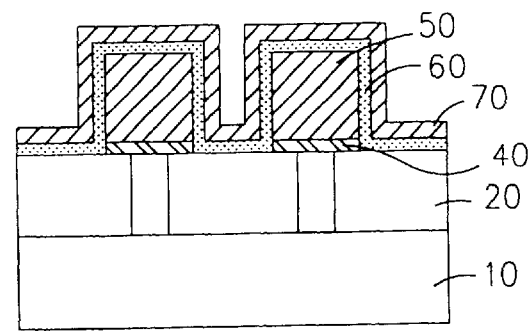

Referring to FIG. 3E, an upper electrode 70 is formed on the dielectric film 60. Identically to the lower electrode 50, Pt, RuO, Ru, $IrO_x$ or Ir may be used for forming the upper electrode 70.

Figure 3F:
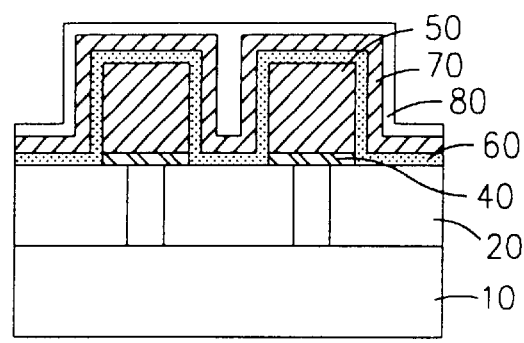
Figure 3G:
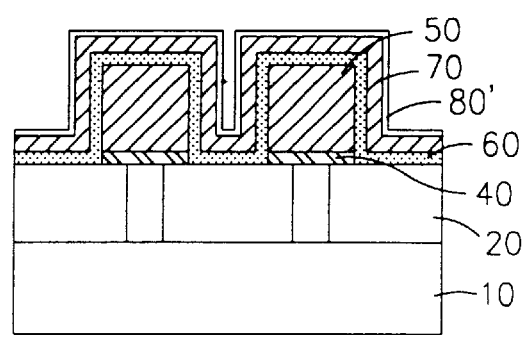

As illustrated in FIG. 3F, a first different type film 80 is formed on the upper electrode 70, and a thermal process is carried out thereon. A material for the first different type film 80 is determined by the material of the upper electrode 70. That is, when the upper electrode 70 is formed of Pt or Ru, the first different type film 80 is formed of the polycrystalline silicon, and then the thermal process is performed thereon. As a result, the upper electrode 70 of Pt or Ru reacts with the first different type film 80 of the polycrystalline silicon, thus forming a silicide. Accordingly, as shown in FIG. 3G, a volume of the first different type film 80' is decreased, and thus the compressive stress is applied to the dielectric film 60 positioned therebelow. On the other hand, when the upper electrode 70 is formed of a nonmetal such as $RuO_x$ or $IrO_x$, a material which is capable of forming a silicide such as Co, Ti, Pt or Ru and polycrystalline silicon are deposited and thermally processed. The first different type film 80 forms the silicide and reduces in volume. As a result, the compressive stress is applied to the dielectric film 60 positioned therebelow.

Figure 3H:
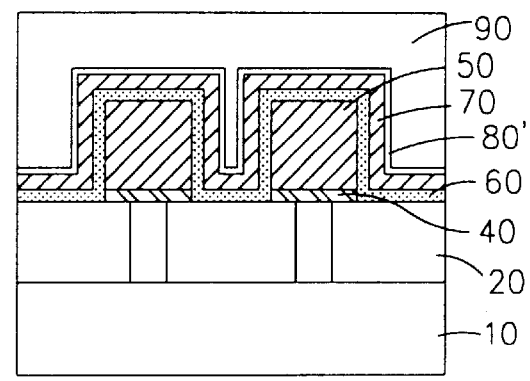
Figure 3I:
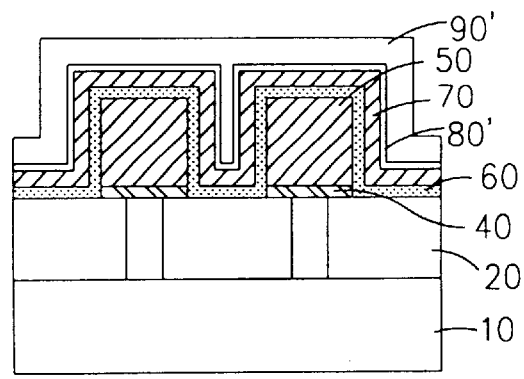

Fabrication of a capacitor of a semiconductor memory device in accordance with the first embodiment of the present invention may be completed at this stage. Or, selectively, additional compressive stress may be applied to the dielectric film 60 by forming a second different type film 90. As depicted in FIG. 3H, the second different type film 90 formed of an insulation material such as $SiO_2$ is formed on the shrunken first different type material 80' by a chemical vapor deposition process, a physical vapor deposition process, a laser ablation process and the like, and a thermal process is carried out thereon. For the second different type film 90, a tetra ethyl ortho silicate (TEOS) may be formed by a plasma enhanced chemical vapor deposition (PECVD) process, or a glass or an organic material may be formed by a spin coating process. After the thermal process, the second different type film 90' is shrunken, thereby applying a compressive stress to the dielectric film 60 positioned therebelow, as shown in FIG. 3I. As a result, the dielectric property of the dielectric film 60 is efficiently improved. In general, a glass formed by the spin coating process may decrease in volume by 10 to 30% depending on the particular type of thermal process. Therefore, such a glass is very effective in generating the compressive stress on the dielectric film.

In the capacitor for the semiconductor memory device according to the first embodiment of the present invention as shown in FIGS. 3A to 3I, the different type film is formed on the upper electrode in parallel to the dielectric film. It is then shrunken, thereby applying the compressive stress to the dielectric film.

On the other hand, in accordance with a second embodiment of the present invention, the different type film is formed adjacently to side portions of the capacitor, namely in a vertical direction to the dielectric film. Thereafter, the different type film is expanded, and thus a compressive stress is relatively applied to the dielectric film. A fabrication method of a capacitor for a semiconductor memory device in accordance with the second embodiment of the present invention will now be described in detail with reference to FIGS. 4A to 4F.

Figure 4A:
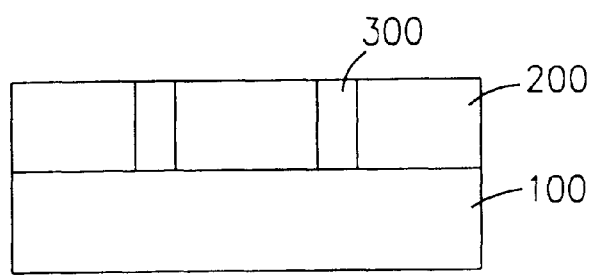
FIGS. 4A to 4F are cross-sectional views illustrating sequential steps of a process of fabricating a capacitor for a semiconductor memory device in accordance with a second embodiment of the present invention.

As illustrated in FIG. 4A, on a semiconductor substrate 100, an interlayer insulation film 200 is formed and contact plugs 300 are formed in the interlayer insulation film 200 in order to operate the capacitor. A polycrystalline silicon of superior step coverage is filled in the contact plugs 300. In addition to polycrystalline silicon, materials having excellent electric conductivity and superior step coverage, such as tungsten, may be filled in the contact plugs 300.

Figure 4B:
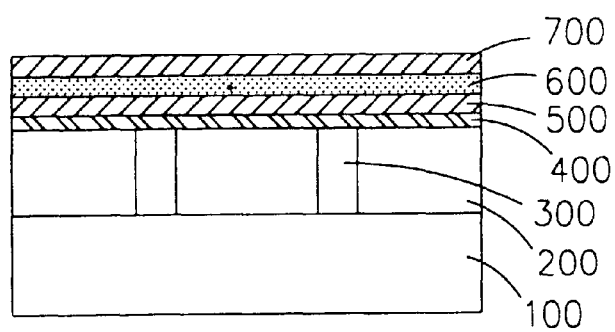

As shown in FIG. 4B, a diffusion barrier film 400 of TiN is formed on the interlayer insulation film 200 including the contact plugs 300. A lower electrode 500 of Pt is formed on the diffusion barrier film 400. Thereafter, a dielectric film 600 of PZT is formed on the lower electrode 500 by a chemical vapor deposition (CVD) process, and an upper electrode 700 is formed on the dielectric film 600. Here, the diffusion barrier film 400 serves to restrict reactions between the lower electrode 500 and the contact plugs 300.

In addition to TiN, a two-components nitride such as TaN may be used as the diffusion barrier film 400, or a three or more components nitride such as Ti—Si—N and Ti—Al—N may be employed in order to improve its oxidation resisting property.

In addition to PZT, BST can also be used to form the dielectric film 600. The dielectric film 600 may also be formed by a physical vapor deposition (PVD) process, a sol-gel process, a laser ablation process and the like. Here, if the dielectric film 600 is formed of an amorphous, and thus a crystallization process by a thermal process is necessary, the thermal process for crystallization of the dielectric film is carried out before the thermal process for expanding the different type film is performed.

In addition to Pt, materials which are less likely to react with the dielectric film 600 and which have a higher work function, such as $RuO_x$, Ru, $IrO_x$ or Ir, may be employed as the lower and upper electrodes 500 and 700.

Figure 4C:
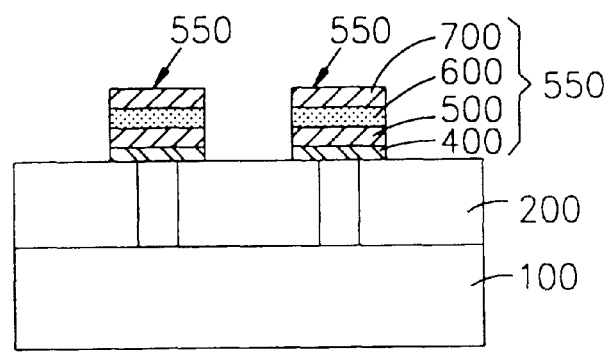

As depicted in FIG. 4C, the upper electrode 700, the dielectric film 600, the lower electrode 500 and the diffusion barrier film 400 are sequentially etched and patterned by using a mask (not shown), thereby forming a capacitor including the patterned upper electrode 700, dielectric film 600, lower electrode 500 and diffusion barrier film 400. A general photoresist material may be used as the mask, or hard mask materials such as $SiO_2$, TiN and Ti may be employed in order to increase a selection ratio and minimize a residue.

An insulation film is formed on a resultant structure shown in FIG. 4C, namely at an upper portion of the exposed interlayer insulation film 200 including an upper portion of the capacitor 550 and at side portions of the capacitor 550. The insulation film is then etched by an etch-back process. As a result, as shown in FIG. 4D, the insulation film remains merely at the side portions of the capacitor 550, forming side wall 650 of the capacitor 550.

Figure 4D:
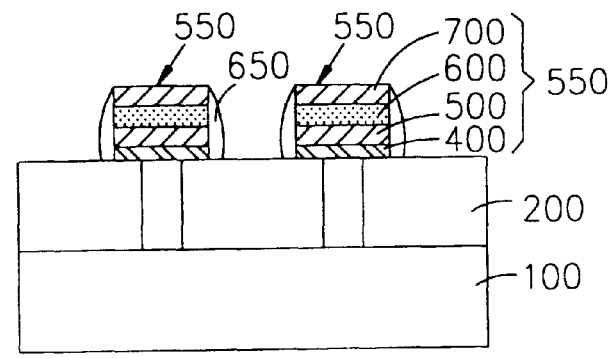
Figure 4E:
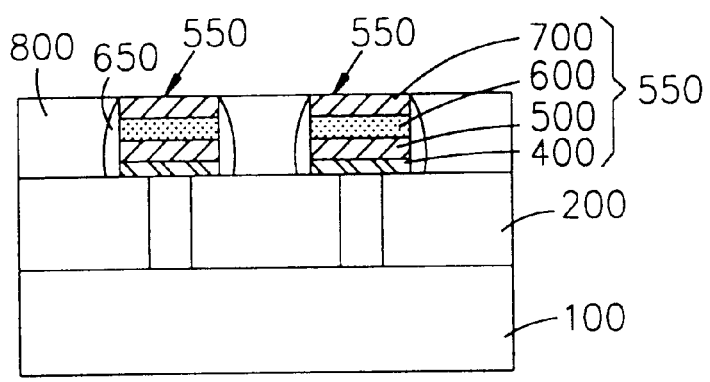

Referring to FIG. 4E, a different type film 800 formed of tungsten is formed on a resultant structure shown in FIG. 4D, namely at the upper portion of the exposed interlayer insulation film 200 including the upper portions of the capacitor 550 and the side portions of the side wall 650. Thereafter, the different type film 800 is chemical-mechanically polished until it has an identical height to the capacitor 550, namely the upper electrode 700. Accordingly, the upper portion of the capacitor 550 is exposed, and the different type film 800 is separated, and thus remains between the capacitors 550. As a result, the different type film 800 is formed adjacently to the dielectric film 600 in a vertical direction. In addition to tungsten, any material with an increased volume after an oxidation reaction may be used to form the different type film 800.

Figure 4F:
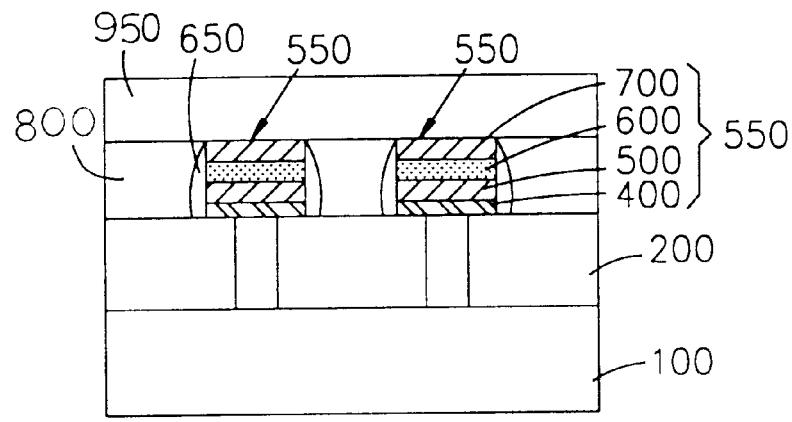

As illustrated in FIG. 4F, a capping layer 950 of $SiO_2$ is formed on the dielectric film 800 and the capacitors 550. Materials for forming the capping layer 950 preferably transmit a reaction gas during a oxidation reaction to be performed in a succeeding process, and prevent the different type film 800 from being expanded in a vertical direction to the dielectric film 600, namely toward the capping layer 950. A silicon nitride film may be used as the capping layer 950, in addition to $SiO_2$.

Thereafter, the different type film 800 is expanded by the oxidation reaction on the resultant structure showing in FIG. 4F. When the different type film 800 is expanded, a compressive stress is relatively applied to the dielectric film 600. Here, the capping layer 950 prevents the different type film 800 from being expanded toward the capping layer 950. Accordingly, the different type film 800 is expanded merely toward the capacitors 550, and thus a relatively high compressive stress is generated on the dielectric film 600. For example, when the different type film 800 is formed of tungsten, the tungsten is oxidized, becomes a tungsten oxide ($WO_x$), and is rapidly increased in volume. Here, the capping layer 950 prevents the tungsten from being expanded toward it, thereby generating a much higher compressive stress on the dielectric film 600.

At this time, fabrication of a capacitor for a semiconductor memory device in accordance with the second embodiment of the present invention is completed.

As discussed above, the capacitor for a semiconductor memory device in accordance with the present invention does not require a single crystal substrate. This is different from the conventional art. In addition, mechanical wafer bending is not required, thus simplifying the entire fabrication process. As a result, the capacitor according to the present invention is much easier to be used in the actual device fabrication process.

Moreover, the method of fabricating a capacitor for a semiconductor device according to the present invention includes depositing films and then etching those films. Thus, a conventional integration process for fabricating a semiconductor device can be used as it is. This results in remarkable cost reduction.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalence.

What is claimed is:

1. A method of fabricating a capacitor for a semiconductor device, comprising the steps of:

forming an interlayer insulation film having contact plugs filled with a conductive material on a semiconductor substrate;

forming a diffusion barrier film on the interlayer insulation film including the contact plugs;

forming a lower electrode on the diffusion barrier film;

forming a dielectric film on the lower electrode;

forming an upper electrode on the dielectric film; and forming a different type film adjacent to the upper electrode for applying a compressive stress to the dielectric film.

2. The method according to claim 1, wherein the dielectric film is formed by using a ferroelectric material selected from the group consisting of $Pb(Zr,Ti)O_3$ and $(Ba,Sr)TiO_3$ and by a process selected from the group consisting of a chemical vapor deposition process, a physical vapor deposition process, a sol-gel process and a laser ablation process.

3. The method according to claim 1, wherein the different type film is formed in contact with an upper surface of the upper electrode.

4. The method according to claim 3, wherein the different type film includes a material which shrinks as a result of a succeeding process including a thermal process.

5. The method according to claim 3, wherein the different type film includes at least first and second different type films.

6. The method according to claim 5, wherein the second different type film is formed by a process selected from the group consisting of a chemical vapor deposition process, a physical vapor deposition process, a laser ablation process and a spin coating process.

7. The method according to claim 1, wherein the different type film is formed adjacently to the upper electrode, the dielectric film, the lower electrode and the diffusion barrier film.

8. The method according to claim 7, further comprising the step of forming a capping layer on the different type film, for preventing the different type film from expanding toward the capping layer.

9. The method according to claim 7, further comprising a succeeding process including an oxidation reaction after forming the different type film, and the different type film is expanded by the succeeding process.

* * * * *